(12) United States Patent
Wiegert (10) Patent No.: US 7,342,399 B1
(45) Date of Patent: Mar. 11, 2008

(54) MAGNETIC ANOMALY SENSING-BASED SYSTEM FOR TRACKING A MOVING MAGNETIC TARGET

(75) Inventor: Roy Wiegert, Panama City Beach, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 121 days.

(21) Appl. No.: 11/417,279

(22) Filed: Apr. 17, 2006

(51) Int. Cl.
*G01V 3/08* (2006.01)
*G01B 7/14* (2006.01)
*G01R 33/00* (2006.01)

(52) U.S. Cl. .................. 324/326; 324/345; 324/244; 324/207.11

(58) Field of Classification Search ........... 324/207.11, 324/207.15, 207.23, 244, 245, 251–260, 324/326, 345; 33/355 R; 701/1, 23, 24
See application file for complete search history.

(56) References Cited

U.S. PATENT DOCUMENTS

| | | | |
|---|---|---|---|
| 5,777,477 A * | 7/1998 | Wynn ...................... | 324/345 |
| 6,476,610 B1 * | 11/2002 | Wiegert et al. ............ | 324/345 |
| 6,841,994 B1 * | 1/2005 | Wiegert .................... | 324/244 |
| 6,865,455 B1 * | 3/2005 | Wiegert .................... | 701/23 |
| 6,888,353 B1 * | 5/2005 | Wiegert .................... | 324/345 |
| 7,038,458 B1 * | 5/2006 | Wiegert .................... | 324/345 |
| 2006/0232259 A1 * | 10/2006 | Olsson et al. ............ | 324/67 |

OTHER PUBLICATIONS

Wieger et al., Magnetic Anomaly Sensing System for Mine Countermeasures Using High Mobility Autonomous Sensing Platforms, IEEExplore, 2002, entire disclosure.*
Wiegert et al., Generalized Magnetic Gradient Contraction Based Method for Detection, Localization and Descrimination of Underwater Mines and Unexploded Ordinance, IEEExplore, 2004, entire disclosure.*

* cited by examiner

*Primary Examiner*—Reena Aurora
*Assistant Examiner*—Kenneth J Whittington
(74) *Attorney, Agent, or Firm*—James T. Shepherd

(57) ABSTRACT

A system for tracking a moving magnetic target uses a magnetic anomaly sensing system to continually determine magnetic gradient tensors associated with the target and converts the magnetic gradient tensors to gradient contraction scalars. A processor uses the magnetic gradient tensors and gradient contraction scalars to determine a minimum of bearing and range to the target. A velocity of the target is determined using the determined bearing and range at two points in time as the target is moving. To continually track with the moving target, the processor determines adjustments in elevation and azimuth using the magnetic gradient tensors and gradient contraction scalars along with bearing, range and determined velocities of the target. The processor can include a routine that determines range while accounting for asphericity errors introduced by the aspherical nature of constant magnetic gradient contours associated with the target.

29 Claims, 6 Drawing Sheets

MAGNETIC ANOMALY SENSING-BASED SYSTEM FOR TRACKING A MOVING MAGNETIC TARGET

ORIGIN OF THE INVENTION

The invention described herein was made in the performance of official duties by an employee of the Department of the Navy and may be manufactured, used, licensed by or for the Government for any governmental purpose without payment of any royalties thereon.

FIELD OF THE INVENTION

The invention relates generally to tracking systems, and more particularly to a system that uses passive magnetic anomaly sensing in order to track a moving magnetic target.

BACKGROUND OF THE INVENTION

There are many potential military and commercial applications for a passive magnetic sensing system that can detect, track and measure the DC magnetic anomaly fields (or signatures) of moving magnetic objects or "targets" in real-time. The word "passive" indicates that the magnetic sensing system does not act to produce magnetic signatures but only detects (and analyzes) a target's inherent magnetic signature. The magnetic signatures are produced in and emanate from the ferrous materials (e.g., steel) that are contained in the physical structure of a target. Targets of interest that produce detectable magnetic signatures include watercraft such as naval vessels and land vehicles such as cars, trucks or military tanks. Frequently, the presence, location, state of motion, and magnetic signature or identity (i.e., classification) of these targets must be determined.

Accurate detection, ranging and classification of magnetic objects usually requires a number of vector magnetic sensors that are configured as magnetic gradiometers. A gradiometer measures magnetic gradients, i.e., the rates of change of magnetic fields with distance. It is known in the art that passive magnetic detection and ranging of moving targets can be achieved by using a stationary magnetic sensing system having a combination gradiometer/magnetometer that measures five independent gradient tensor components and a set of vector field components of the target's magnetic anomaly field. However, prior art approaches have not produced a practical system that can be readily and effectively deployed. The limitations of conventional prior art magnetic detection and ranging systems include the following:

(i) Use of target localization methods that are rather complex, computationally intensive and difficult to implement in a cost effective and easily deployable system.

(ii) The effective response to a fast-moving target may be too slow because the prior art approaches typically may require a significant "time-series" of data be taken before a target can unambiguously be located. Thus, the sensor system response may lag behind the actual position of the target.

(iii) The accuracy may be reduced if a target's magnetic signature changes with the target's motion. That is, prior art approaches for target ranging and classification usually assume that target's magnetic signature vector remains constant while the target is being tracked.

Recently, U.S. Pat. No. 6,476,610 (i.e., "the '610 patent" as it will be referred to hereinafter) disclosed a novel magnetic gradiometer and signal processing concept denoted as "Scalar Triangulation and Ranging" (STAR) for target localization from maneuverable sensing platforms. The STAR method uses unique, rotationally invariant scalar "contractions" of magnetic gradient tensor components to "triangulate" relative distances to a target. Within the target-detection distance of a STAR-type gradiometer, the scalar triangulation process does not directly depend on the target's magnetic dipole strength.

More recently, U.S. Pat. No. 6,841,994 (i.e., "the '994 patent" as it will be referred to hereinafter) disclosed significant improvements to the STAR design and method that better determine the range, relative bearing and magnetic signature of a stationary target from a mobile sensing platform. However, the '610 patent and the '994 patent primarily address the problem of detection and ranging of fixed targets with constant magnetic signature vectors. Thus, in terms of tracking a moving target, the teachings of the '610 and '994 patents have the following limitations:

(i) Their general target-ranging methods may yield inaccurate or ambiguous results for certain sensor orientations relative to the target.

(ii) They do not disclose effective operational modalities for the general case of a moving target whose velocity and magnetic dipole signature may be changing with time.

(iii) They do not take into account "asphericity errors" of the gradient contraction-based STAR method that may reduce the accuracy of target ranging and signature measurements made using the STAR method.

Figure 1A:
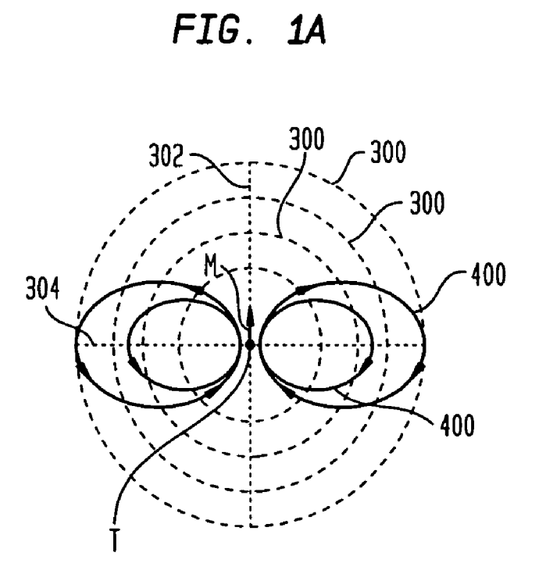
FIG. 1A is a qualitative two-dimensional graphic view of a magnetic object's magnetic dipole field and contours of the constant gradient contractions associated with the magnetic dipole field.
Figure 1B:
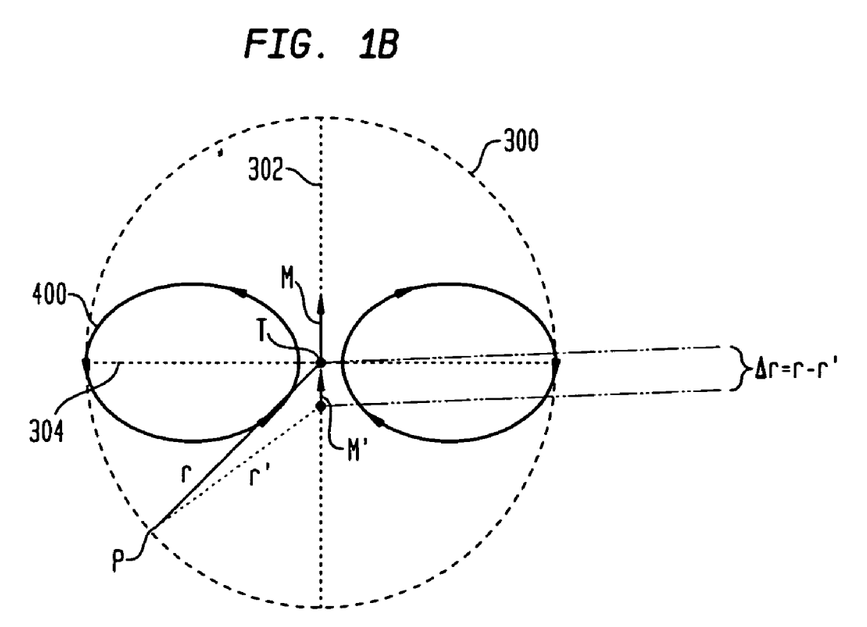
FIG. 1B is a qualitative two-dimensional graphic view of a single constant gradient contraction contour illustrating the ranging and magnetic signature errors introduced by the aspherical nature of the constant gradient contraction contour.

The above-mentioned "asphericity errors" will now be explained with the aid of FIGS. 1A and 1B. As disclosed in the '610 and '994 patents, the gradient contraction $C_T^2$ of the full, nine-component magnetic gradient tensor is a rotationally invariant and robust scalar that is independent of gradiometer orientation. The mathematical and geometrical properties of $C_T$ are graphically represented in FIG. 1A where contours of constant $C_T$ (qualitatively represented by dashed contour lines 300) form concentric prolate spheroidal surfaces that enclose a source (e.g., target T) of the magnetic anomaly field. The dipole axis of the field is illustrated by dotted line 302 and the field's transverse or "equator" axis is illustrated by dotted line 304. Magnetic lines of force of the dipole field are illustrated by solid force lines 400.

Additional reference will now be made to FIG. 1B where only one of contours 300 is illustrated for clarity of description. At a given sensor-target distance "r", $C_T$ is primarily a function of the magnetic dipole moment M of target T, distance r, and a dimensionless asphericity parameter "k". The k-parameter characterizes the variance of $C_T$ (owing to the prolate spheroidal nature of contours 300) from true spherical symmetry. Specifically, for media with constant magnetic permeability $\mu$, $C_T = k(\mu/4\pi)M/r^4$ where calculations show that k slowly varies from approximately 7.3 for points aligned with the dipole axis 302 to 4.2 for points on equator 304. Conversely, for contours of constant gradient contraction, the ratio of the diameter at dipole axis 302 to the diameter at equator 304 is only approximately 1.14 to 1.

The aspherical nature of the constant $C_T$ contours can cause inaccuracies or "asphericity errors" in the STAR methods described in the '610 and '994 patents. For example, referring to FIG. 1B, for a sensor position P located between dipole axis 302 and equator 304, application of the STAR method produces a measured vector position or range r' and a measured target dipole moment M' that can differ slightly from the true values of range r to target T and the dipole moment M thereof.

SUMMARY OF THE INVENTION

Accordingly, it is an object of the present invention to provide an improved magnetic anomaly sensing-based system for detection and ranging of magnetic objects.

Another object of the invention is to provide a magnetic anomaly sensing system that can be used to detect a moving magnetic object, and accurately determine the object's position and changes in its position, velocity and magnetic moment signature.

Still another object of the invention is to provide a magnetic anomaly sensing system that can be used to detect a moving magnetic object while compensating for the aspherical nature of the magnetic object's gradient contraction contours.

Yet another object of the invention is to provide a magnetic anomaly sensing system that can be used to remotely align or point an external device or system at a moving magnetic object.

Other objects and advantages of the present invention will become more obvious hereinafter in the specification and drawings.

In accordance with the present invention, a system for tracking a moving target that has a magnetic signature includes a non-magnetic positioner capable of being adjusted in elevation and azimuth. A magnetic anomaly sensing system is coupled to the positioner for movement therewith. The magnetic anomaly sensing system continually determines magnetic gradient tensors associated with the target and converts the magnetic gradient tensors to gradient contraction scalars. A processor is coupled to the magnetic anomaly sensing system and the positioner. The processor uses the magnetic gradient tensors and gradient contraction scalars to control the positioner and to determine at least bearing and range to the target. A velocity of the target is determined using the determined bearing and range at two points in time as the target is moving. The processor determines adjustments in elevation and azimuth of the positioner by using the afore-mentioned gradient contraction scalars to provide target-tracking parameters and to determine bearing and range along with the determined velocity of the target. The processor can include a routine that determines range while accounting for asphericity errors introduced by the aspherical nature of constant magnetic gradient contours associated with the target.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 2:
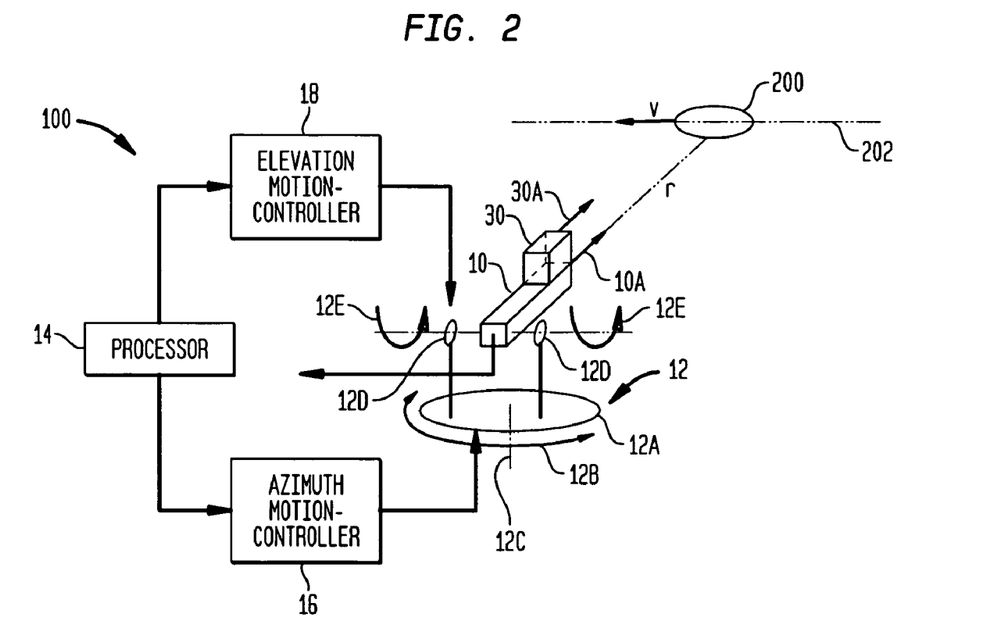
FIG. 2 is a schematic view of a system for tracking a moving magnetic target in accordance with the present invention.

Referring again to the drawings and more particularly to FIG. 2, a system for tracking a moving magnetic target 200 in accordance with the present invention is shown and is referenced generally by numeral 100. The term "target" as used herein refers to any object whose movement is of interest such that the tracking thereof is desirable. Magnetic target 200 is any natural or man-made object that moves on the ground, in the air, or in the water, with the object having an inherent magnetic signature owing to the ferrous material(s) that are included in the object's physical structure. Target 200 can be a self-propelled vehicle, a launched projectile without it's own propulsion, etc., that is moving along a path 202 at a constant or accelerating/decelerating velocity "v" thereby making the velocity changeable in direction and magnitude.

At the heart of system 100 is a magnetic anomaly sensing system 10 that can passively measure magnetic gradient tensors associated with the magnetic signature of target 200, and then convert the tensor data to gradient contraction scalars. Such a magnetic anomaly sensing system is disclosed in detail in U.S. Pat. No. 6,841,994, the entire contents of which are hereby incorporated by reference. Briefly, magnetic anomaly sensing system 10 uses a plurality of triaxial magnetometer (TM) sensors with each of the TM sensors having X,Y,Z magnetic sensing axes. The TM sensors are arranged in a three-dimensional array with respective ones of the X,Y,Z magnetic sensing axes being mutually parallel to one another in the three-dimensional array. The three-dimensional array defines a geometry that forms a plurality of single-axis gradiometers. A processor coupled to the TM sensors generates complete gradient tensors and corresponding complete gradient contractions for the gradiometers.

Figure 3:
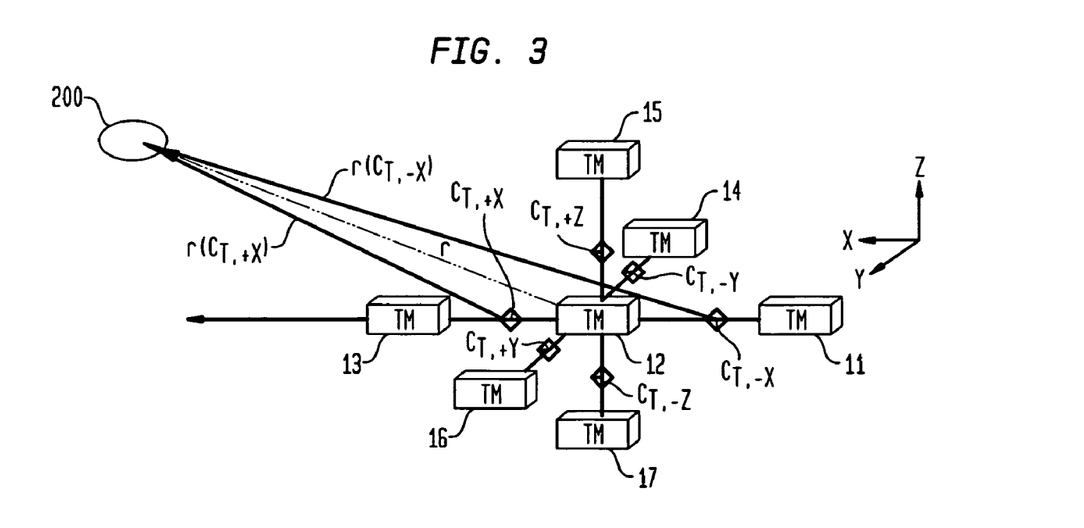
FIG. 3 is a seven triaxial magnetometer (TM) sensor array that can be used in the tracking system of the present invention.
Figure 4:
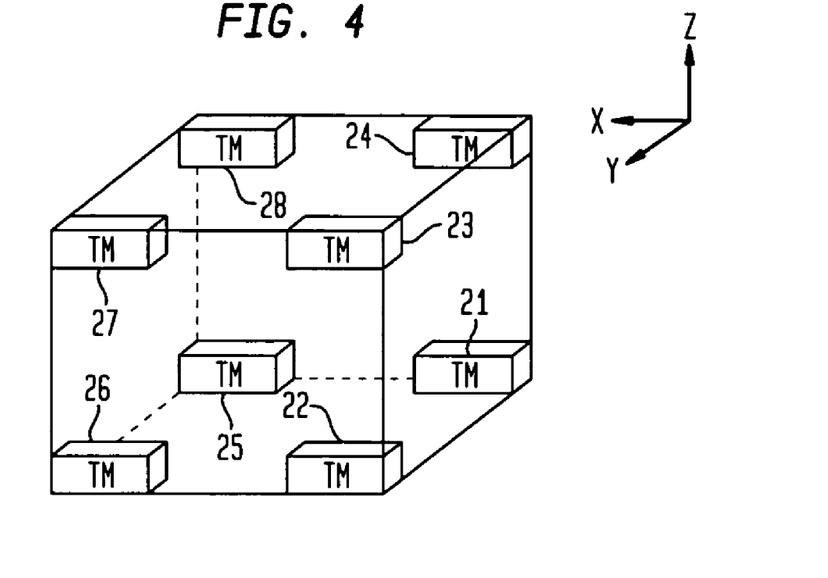
FIG. 4 is an eight TM sensor array that can be used in the tracking system of the present invention.

Magnetic anomaly sensing system 10 can utilize a variety of geometric arrangements of TM sensors without departing from the scope of the present invention. Two such non-limiting examples will be presented herein and are illustrated in FIGS. 3 and 4. In FIG. 3, the geometric arrangement of TM sensors comprises an array of seven TM sensors 11-17, each of which measures three orthogonal (XYZ) vector components of the magnetic field associated with magnetic target 200. The TM sensors' respective XYZ sensing elements are parallel to one another. The center of the array's XYZ coordinates is located at the geometric center of TM sensor 12. The range r to target 200 is referenced to the center of the TM sensor array which, in FIG. 3, is the center of TM sensor 12.

TM sensors 11-13 have their X-axes collinearly aligned and evenly spaced apart from one another. TM sensors 14-17 are arranged at the vertices of a square, the plane of which includes TM sensor 12 and is perpendicular to the array's X-axis along which TM sensors 11-13 are aligned. Since TM sensor 12 is the geometric center of the array, TM sensor 12 resides at the center of the square formed by TM sensors 14-17. Also, since the X, Y and Z axes associated with all of TM sensors 11-17 are parallel to one another, each pair of TM sensors forms a single-axis gradiometer aligned in each of the X, Y and Z directions.

A processor (not shown) develops combinations of magnetic field and gradient data and computes total gradient contraction parameters $C_{T,(\pm XYZ)}$. Each respective $C_T$-type parameter corresponds to (or "operates at") a particular point located on a coordinate axis of the array. Furthermore, for each $C_T$-point at a given distance along a given coordinate axis direction, there is another $C_T$-point located at the same distance but in the opposite direction. For example, for the $C_T$-parameter located a distance +Z from the center of the array (i.e., $C_{T,+Z}$), there corresponds a $C_T$-parameter located a distance −Z from the center (e.g., $C_{T,-Z}$). The operating points of the $C_T$-parameters constitute the end-points of an orthogonal array of triangulation baselines that are aligned along the XYZ directions and pass through the center of the TM sensor array. The $C_T$-parameters and triangulation baselines constitute the primary target-ranging, target-classification and motion-control data of system 100 of the present invention.

Figure 5:
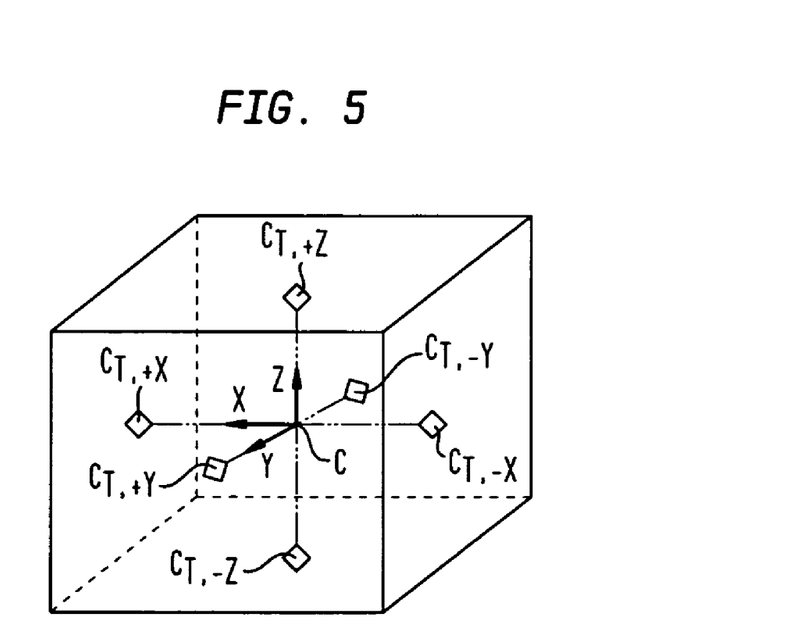
FIG. 5 is a graphic view of the $C_T$-parameters and triangulation baselines associated with the eight TM sensor array embodiment of FIG. 4.

In FIG. 4, another geometric array of TM sensors is presented. Specifically, an array of eight TM sensors 21-28 is arranged in a cubic structure. Magnetic field data from this embodiment can be used to develop a set of $C_T$-parameters and triangulation baselines equivalent to those developed by the array of FIG. 3. Compared to the array of FIG. 3, the cubic array in FIG. 4 has the advantage of providing greater symmetry and longer triangulation baselines for a given sensor array volume. For clarity of illustration, the $C_T$-parameters and the triangulation baselines associated with this TM sensor arrangement are shown separately in FIG. 5 with the vertices of the illustrated cube being the locations of TM sensors 21-28 shown in FIG. 4. The center of coordinates "C" is at the geometric center of the cube. The data from the each set of four TM sensors on a face of the cube can be used to construct total gradient contraction-type parameters whose effective operating points are endpoints located at the center of each face of the cube. The resultant triangulation baselines are symmetrically situated along the coordinate axes and pass through the geometric center C of the sensor array.

FIGS. 3 and 4 show two embodiments of TM sensor arrays that can provide data for an effective tracking system 100. In operation, either sensor arrangement will allow development of a spatially symmetrical three-dimensional array of total, nine-component gradient tensors and their respective total gradient contractions $C_{T,i}$. For this invention, the $C_{T,i}$ quantities constitute the basic "parameter space" for tracking system operation. Thus, in general, an appropriately designed TM sensor array for magnetic anomaly sensing system 10 used in tracking system 100 should provide the following elements:

(1) An array of $C_{T,i}$ quantities whose operating points are symmetrically disposed about a geometric center of symmetry of the TM sensor array. For convenience, the origin of a Cartesian (XYZ) coordinate system is defined to coincide with the geometric center of symmetry. The coordinate system is oriented so that for each $C_{T,+i}$ quantity there corresponds a $C_{T,-i}$ quantity. Thus, for FIGS. 3 and 4, the $C_{T,i}$ quantities are arranged in paired sets or "parameter axes" $(C_{T,+X},C_{T,-X})$, $(C_{T,+Y},C_{T,-Y})$ and $(C_{T,+Z},C_{T,-Z})$ along the system's XYZ coordinate axes.

(2) The $C_{T,i}$ quantities define the following:

(i) A "Primary Ranging Axis" (PRA) that coincides with the forward-pointing or aiming direction of tracking system 100. In the present invention's target-tracking mode, when the system is locked onto target 200, the PRA will point at and follow target 200. For purpose of illustration, the PRA in FIGS. 3 and 4 is along the X-coordinate of the TM sensor array. Partial and/or total magnetic gradient data from positions along the PRA are used to determine vector components of target range. Then, the PRA data are substituted into any three independent gradient tensor equations and the resulting equations are solved to determine the magnetic moment of the target.

(ii) An orthogonal pair of "Transverse Guidance Axes" (TGA) that correlate with the azimuth and elevation directions of the TM sensor array. Thus, the TGAs provide target-tracking signals for controlling the azimuth and elevation of the TM sensor array, and/or for pointing a servo-controlled remote system or device at a target. In FIGS. 3 and 4, the azimuth and elevation TGAs are along the Y and Z-coordinate directions, respectively. The TGA data sets also can be used to provide magnetic signature strength by the methods described in the previously-referenced U.S. Pat. No. 6,841,994 and/or by conventional tensor gradiometry.

Referring again to FIG. 2, magnetic anomaly sensing system 10 is mounted on a positioning assembly 12. The forward-pointing direction of sensing system 10 is indicated by arrow 10A. In general, positioning assembly 12 is an arrangement of non-magnetic components that can manipulate sensing system 10 such that it's forward-pointing direction 10A can be adjusted in azimuth and elevation. Positioning assembly 12 is non-magnetic in nature in order to optimize the accuracy of sensing system 10 with respect to the detection and tracking of target 200.

Briefly, positioning assembly 12 can include some type of rotatable platform 12A that can be rotated in either azimuth direction 12B about an axis of rotation 12C. Mounted to platform 12A is an elevation adjustment mechanism 12D (e.g., supports, gears, bearings, etc.) capable of moving sensing system 10 in elevation as represented by arrow 12E. It is to be understood that positioning assembly 12 could be realized by a variety of embodiments thereof without departing from the scope of the present invention.

The output of magnetic anomaly sensing system 10 is provided to a processor 14. The term "output" here can mean the magnetic gradient tensors and associated gradient contraction scalars developed by sensing system 10 as described briefly above and in detail in U.S. Pat. No. 6,841,994. However, the output of sensing system 10 could also be raw TM sensor data in which case processor 14 would be equipped to generate the magnetic gradient tensors and associated gradient contraction scalars. In either case, processor 14 continuously (e.g., at intervals of 0.01-0.1 seconds) generates gradient data. The magnetic gradient data (i.e., the gradient tensors and associated gradient contraction scalars) can be used to (i) detect the target, (ii) generate target-tracking signals and supply same to elevation motion-controller 18 and azimuth motion-controller 16 so that the motion-control system 12 aligns forward-pointing direction 10A at target 200 and continuously maintains forward-pointing direction 10A pointed at target 200, and (iii) determine target range, velocity, acceleration and magnetic moment signature once forward-pointing direction 10A is pointed at target 200.

Figure 6:
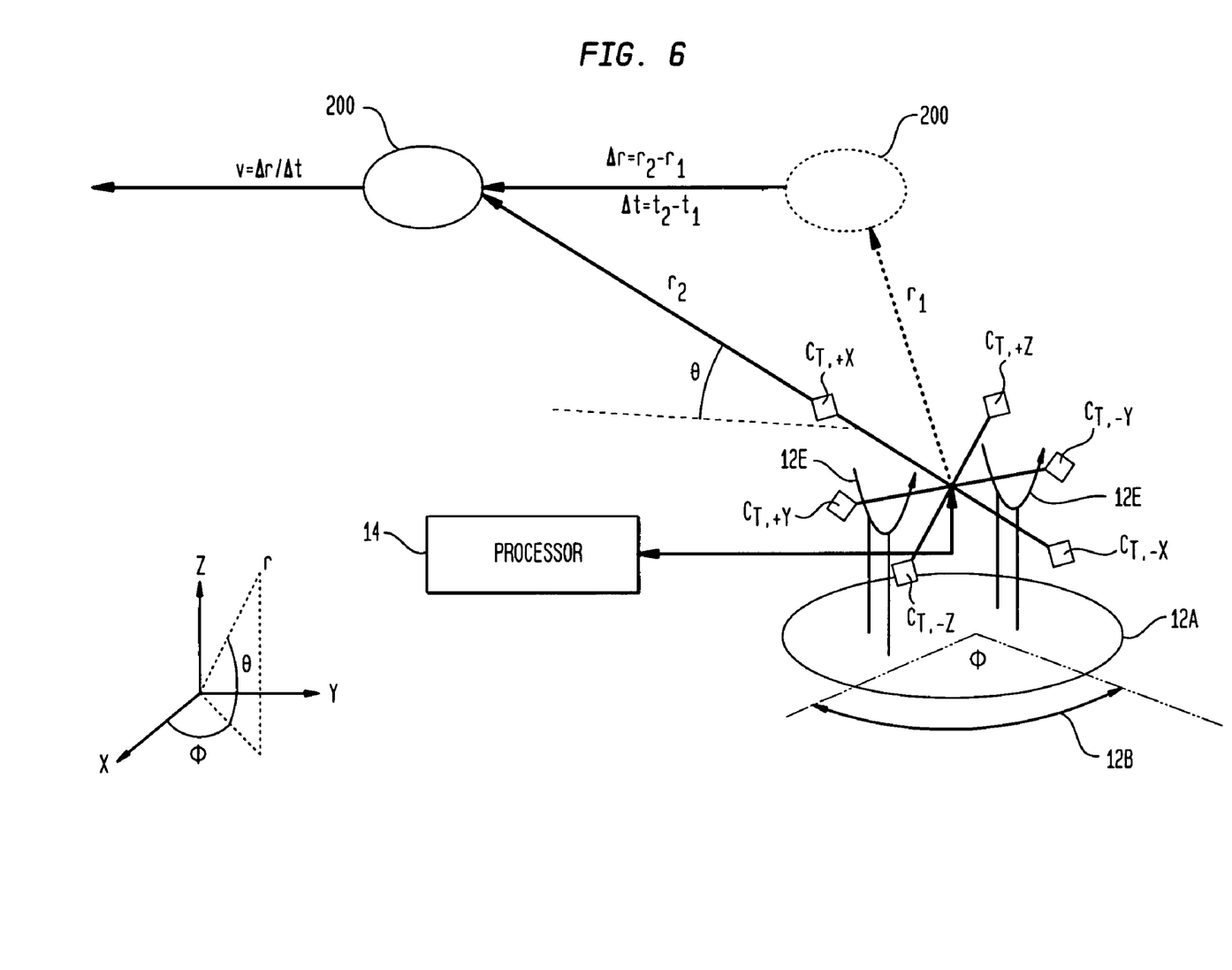
FIG. 6 is a graphic view of the $C_T$-parameters and triangulation baselines when the present invention is in the tracking mode.

This is illustrated by way of example in FIG. 6. In this illustration, processor 14 uses the magnetic gradient tensors and associated gradient contraction scalars at a time (e.g., $t_1$) when target 200 has been detected and tracking system 100 (FIG. 2) is "locked onto target 200" (i.e., forward-pointing direction 10A is pointed at target 200). At this point, bearing, range "r" to target 200 and the target's magnetic dipole signature "M" are determined, i.e., $r_1$ and $M_1$ at time $t_1$. Target detection as well as bearing, range and magnetic signature determination using sensing system 10 is described in detail in U.S. Pat. No. 6,841,994.

The bearing, range and magnetic signature are next determined at a second time $t_2$ when target 200 has moved some distance such that a second range $r_2$ and a second measurement of magnetic signature $M_2$ are determined. The change in range and magnetic signature (i.e., $r_2-r_1$ and $M_2-M_1$, respectively) divided by the change in time (i.e., $t_2-t_1$) is indicative of the velocity $v_{1,2}$ of target 200 during the time interval between $t_1$ and $t_2$. The time-rate-of-change of the magnetic signature from time $t_1$ to $t_2$ is defined as $(M_2-M_1)/(t_2-t_1)$. This process can be repeated for consecutive target positions. The differences between consecutively determined velocities divided by the respective change in time is indicative of kinematic acceleration. The differences between consecutively determined magnetic signatures divided by the respective change in time is indicative of the second time-derivative of the magnetic signature of target 200. The present invention's ability to account for changing magnetic signatures allows it to be used to track and classify targets whose magnetic signature changes with target motion/orientation in the Earth's magnetic field.

In the event that tracking system 100 were to lose its lock on a target, processor 14 could use the last measured values of range, bearing, velocity and acceleration to predict new values of the respective target-tracking variables. A variety of well known geometric/analytical prediction schemes could be used without departing from the scope of the present invention. Thus, when tracking system 100 is locked onto a target, the aforementioned Transverse Guidance Axes (TGA) provide servo-control signals for maintaining forward-pointing direction 10A pointed at the target. When the system loses lock, the last measured values of target position, velocity and acceleration provide servo-control signals so that forward-pointing direction 10A is pointed towards predicted future positions of the target. In either case, the control signals are provided to both an azimuth motion controller 16 (coupled to platform 12A) and an elevation motion controller 18 (coupled to elevation adjustment mechanism 12D). Thus, tracking system 100 is a feedback-based system that will keep forward-pointing direction 10A of sensing system 10 aligned with moving target 200.

Tracking system 100 could also include a device 30 having a forward aiming direction 30A. Device 30 is any camera, weapon system, alarm system, etc., whose operative function is keyed to aiming direction 30A. Accordingly, device 30 is coupled to positioning assembly 12 such that forward-pointing direction 10A (of sensing system 10) and aiming direction 30A are co-aligned. Device 30 can be coupled to sensing system 10 (as shown) or could be coupled directly to positioning assembly 12. Note that the inclusion of device 30 in proximity to sensing system 10 assumes that device 30 has a minimal or non-existent magnetic signature. If, however, device 30 has a magnetic signature of consequence, device 30 can be located remotely with respect to sensing system 10 as will be explained further below.

The operational details of tracking system 100 will be explained further with the aid of FIG. 6 where the $C_T$-parameters and triangulation baselines of a TM sensor array (not shown) are represented by a symmetrical 3-D array of six points that correspond to the $C_{T,i}$-parameters and the orthogonal baselines that provide the invention with its improved magnetic detection and ranging capabilities.

The origin of the system's Cartesian (XYZ) coordinates and spherical (rθφ) coordinates is located at point C or the geometrical center of the TM sensor array. Here, the coordinates are defined so that the system's X-axis contains the TM sensor array's "ranging axis" that is determined by the parameters $C_{T,+X}$ and $C_{T,-X}$. The coordinate system's Y-axis contains an orthogonal triangulation baseline and the azimuth-control parameters $C_{T,+Y}$ and $C_{T,-Y}$. The Z-axis contains another orthogonal triangulation baseline and the elevation-control parameters $C_{T,+Z}$ and $C_{T,-Z}$.

As explained above, the present invention uses the $C_T$-parameters to detect, lock onto, track and classify moving magnetic target 200. While tracking, the system's feedback control loop adjusts the TM sensor array's azimuth and elevation until the respective control parameters are equal (i.e., $C_{T,+Y}=C_{T,-Y}$ and $C_{T,+Z}=C_{T,-Z}$) to point the array's X-axis directly at target 200. At the same time, the system's processor 14 develops data corresponding to the target's elevation θ, relative bearing φ, range r, velocity v, acceleration a, and the XYZ-components of magnetic dipole moment M and ΔM/Δt, etc., as the means to classify target 200 and its state of motion.

Figure 7:
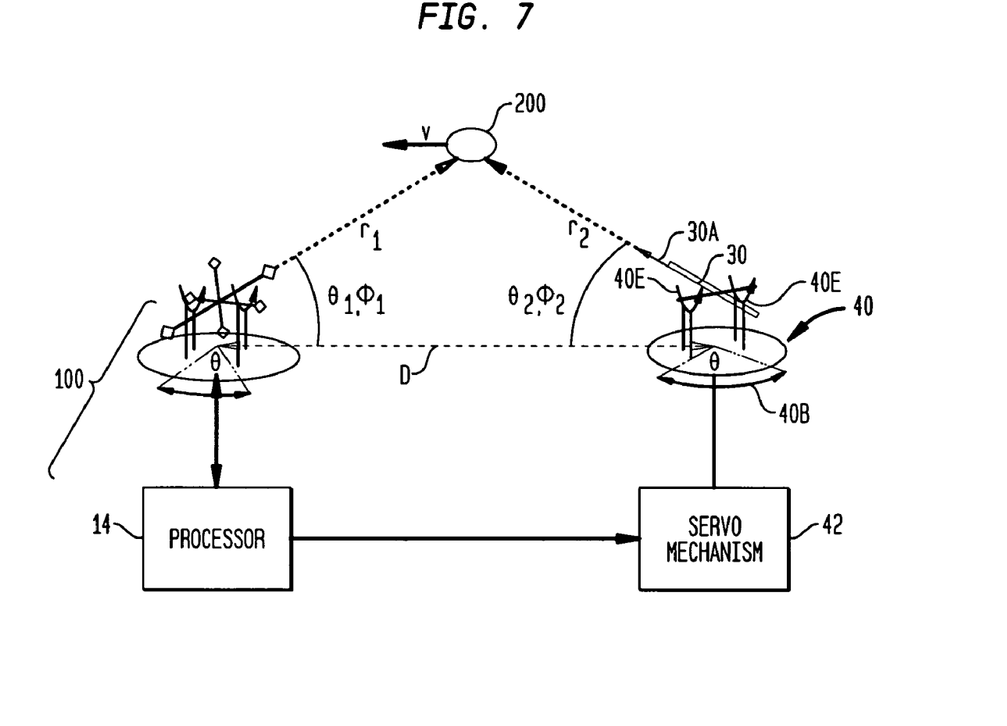
FIG. 7 is a schematic view of another embodiment of the present invention in which the tracking system controls the aiming direction of a remotely-located targeting device.

As mentioned above, the present invention can also control a remotely-located device 30 as will now be explained with the aid of FIG. 7. In this embodiment, device 30 is coupled to another positioning assembly 40 that is essentially identical in capability to positioning assembly 12. That is, positioning assembly 40 can move device 30 in azimuth 40B and elevation 40E in order to control alignment of aiming direction 30A. Device 30/positioning assembly 40 are located a distance D away from tracking system 100 which has been illustrated without some of its elements for clarity of illustration. As explained previously, tracking system 100 determines primary target parameters $r_1$, $\Delta r_1/\Delta t$, $\Delta v/\Delta t$, $\theta_1$, $\phi_1$ and M at it's location. Using simple trigonometric relations, the primary target parameters can be correlated with distance D to provide the respective target parameters ($r_2$, $\theta_2$ and $\phi_2$) at the location of device 30/positioning assembly 40. A servo mechanism 42 coupled to the processor of tracking system 100 and positioning assembly 40 uses the $r_2$, $\theta_2$ and $\phi_2$ parameters to aim device 30 at target 200.

As described earlier herein with reference to FIGS. 1A and 1B, target ranging and classification predicated on the methods disclosed in U.S. Pat. No. 6,841,994 are subject to errors due to the aspherical nature of the $C_T$ contours. Although these errors have been shown to be relatively small (e.g., within 1% and 7 degrees of range and bearing error and within 13% of magnetic moment), the errors may still be too large for many targeting applications requiring a higher degree of precision. Accordingly, tracking system 100 can include asphericity error compensation where such compensation methodology would typically be programmed into processor 14.

Figure 8:
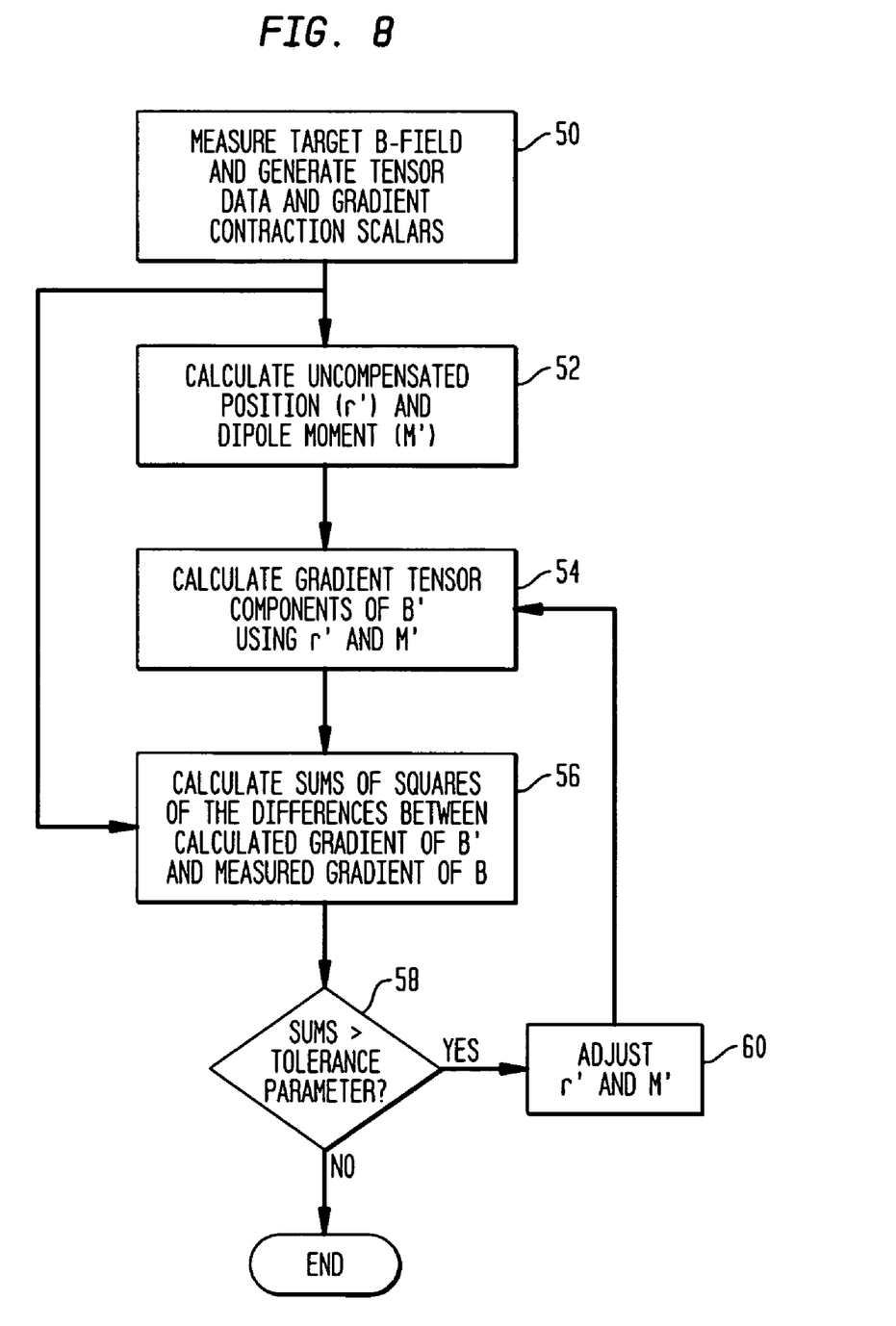
FIG. 8 is a flow chart of the asphericity error compensation that can be employed by the tracking system of the present invention.

A flow chart of the asphericity error compensation of the present invention is presented in FIG. 8. Briefly, the error compensation employs a conventional least-squares-fit-type approach that iteratively adjusts the solutions for target position (r) and magnetic moment (M). More specifically, at step 50, it is assumed that magnetic anomaly sensing system 10 has detected a target (e.g., target 200), has measured components of a total magnetic field B emanating from the target, and has generated (or provided the raw data for such generation) magnetic gradient tensor data and associated gradient contraction scalars. Next, at step 52, tracking system 100 calculates a first approximation of target position and target magnetic moment which will deviate slightly from the true values thereof owing to asphericity errors. Accordingly, step 52 essentially calculates r' and M' (FIG. 1B) using the method of the '994 patent. Then, using the well known magnetic field "dipole approximation"

$$B(r)=(\mu/4\pi)[3(M \cdot r)r/r^5 - M/r^3]$$

and the resulting set of five independent tensor equations corresponding to the gradient of B (i.e., $\Lambda B$), step 54 calculates the tensor values (e.g., $\partial B_x/\partial x$, $\partial B_x/\partial y$, etc.) that would be produced by r' and M'.

At step 56, using the results from steps 50 and 54, a calculation of the sum of the squares of the differences between measured and calculated tensor values is performed for both the r' and M' parameters. The sums generated at step 56 are compared at step 58 to some predetermined tolerance parameters. Specifically, if the sums from step 56 are greater than the tolerance parameters, the values for r' and M' are adjusted (i.e., incremented) at step 60 and processing returns to step 54. Steps 56 and 58 are then repeated until the smallest sums (generated at step 56) are obtained with the resulting set of position (r) and dipole moment (M) values representing the best fit.

The advantages of the present invention are numerous. The tracking system provides the capability to determine a rapidly moving target's relative bearing, range, velocity and magnetic moment, and the capability to physically aim a device at the target. A unique method is also presented for compensation of "asphericity errors" of STAR-type magnetic anomaly sensing systems by using STAR-derived data in a rapidly-converging conventional tensor-based least-squares-fit approach.

Although the invention has been described relative to specific embodiments thereof, there are numerous variations and modifications that will be readily apparent to those skilled in the art in light of the above teachings. For example, a networked arrangement of a plurality of spatially separate tracking systems of the present invention could be deployed over a region with the outputs from each tracking system being correlated at a master processor. This correlated wide-area application would provide enhanced detection, localization and classification (DLC) of magnetic targets. This type of arrangement would also provide a unique capability for target-ranging that is substantially independent of possible targeting errors due to near-field-produced inaccuracies of dipole equation-based gradiometer approaches. Still further, the invention could be adapted to maneuverable sensing platforms where, for example, a platform could maintain a steady course while the present invention's tracking system provided a platform-motion-independent set of target DLC information. It is therefore to be understood that, within the scope of the appended claims, the invention may be practiced other than as specifically described.

What is claimed as new and desired to be secured by Letters Patent of the United States is:

1. A system for tracking a moving target that has a magnetic signature, comprising:
    a non-magnetic positioner capable of being adjusted in elevation and azimuth;
    a magnetic anomaly sensing system coupled to said positioner for movement therewith, said magnetic anomaly sensing system determining magnetic gradient tensors associated with the target and converting said magnetic gradient tensors to gradient contraction scalars; and
    a processor coupled to said magnetic anomaly sensing system and said positioner, said processor using said magnetic gradient tensors and said gradient contraction scalars to determine at least bearing and range to the target wherein a velocity of the target is determined using said bearing and range so-determined at two points in time as the target is moving, said processor (i) determining adjustments in elevation and azimuth of said positioner using said magnetic gradient tensors and said gradient contraction scalars along with said bearing and range and said velocity, and (ii) providing said adjustments to said positioner, wherein said magnetic anomaly sensing system continually determines said magnetic gradient tensors associated with the target as the target is moving.

2. A system as in claim 1 wherein said processor uses (i) said magnetic gradient tensors, (ii) said gradient contraction scalars, and (iii) said range, to determine the magnetic moment associated with the target, wherein said magnetic moment is indicative of a classification of the target.

3. A system as in claim 1 further comprising a non-magnetic targeting device coupled to said positioner and aligned with said magnetic anomaly sensing system.

4. A system as in claim 1 further comprising a second positioner located a distance from said non-magnetic positioner and being capable of adjustment in elevation and azimuth, said processor determining adjustments in elevation and azimuth of said second positioner for alignment thereof with the target as the target is moving using said bearing and range along with said velocity and said distance.

5. A system as in claim 4 further comprising a targeting device coupled to said second positioner and aligned therewith.

6. A system as in claim 1 wherein said magnetic anomaly sensing system includes a sensor array comprising a plurality of triaxial magnetometer (TM) sensors with each of said TM sensors having X,Y,Z magnetic sensing axes, said plurality of said TM sensors arranged in a three-dimensional array with respective ones of said X,Y,Z magnetic sensing axes being mutually parallel to one another in said three-dimensional array, said three-dimensional array defining a geometry that (i) collinearly aligns at least three of said plurality of TM sensors in a spaced-apart fashion along an axis to form a plurality of single-axis gradiometers along one of said X,Y,Z magnetic sensing axes, and (ii) positions at least four of said plurality of TM sensors in a spaced-apart fashion in a planar array that is perpendicular to said axis.

7. A system as in claim 6 wherein three TM sensors from said plurality of TM sensors are collinearly aligned along said axis and are evenly spaced therealong, wherein a central one of said three TM sensors is centrally positioned between a remaining two of said three TM sensors.

8. A system as in claim 7 wherein said planar array includes said central one of said three TM sensors.

9. A system as in claim 8 wherein said planar array forms a square having one of said plurality of said TM sensors at each corner thereof.

10. A system as in claim 9 wherein said central one of said three TM sensors lies at the center of said square.

11. A system as in claim 1 wherein said magnetic anomaly sensing system includes a sensor array comprising a plurality of triaxial magnetometer (TM) sensors with each of said TM sensors having X,Y,Z magnetic sensing axes, said plurality of said TM sensors arranged in a cubic array with respective ones of said X,Y,Z magnetic sensing axes being mutually parallel to one another in said cubic array.

12. A system for tracking a moving target that has a magnetic signature, comprising:
  a non-magnetic positioner capable of being adjusted in elevation and azimuth;
  a magnetic anomaly sensing system coupled to said positioner for movement therewith, said magnetic anomaly sensing system determining magnetic gradient tensors associated with the target and converting said magnetic gradient tensors to gradient contraction scalars; and
  a processor coupled to said magnetic anomaly sensing system and said positioner, said processor using said magnetic gradient tensors and said gradient contraction scalars to determine at least bearing and range to the target with determination of said range accounting for asphericity errors introduced by the aspherical nature of constant magnetic gradient contours associated with the target, wherein a velocity of the target is determined using said bearing and range so-determined at two points in time as the target is moving, said processor (i) determining adjustments in elevation and azimuth of said positioner using said magnetic gradient tensors and said gradient contraction scalars along with said bearing and range and said velocity, and (ii) providing said adjustments to said positioner, wherein said magnetic anomaly sensing system continually determines said magnetic gradient tensors associated with the target as the target is moving.

13. A system as in claim 12 wherein said processor uses (i) said magnetic gradient tensors, (ii) said gradient contraction scalars, and (iii) said range, to determine the magnetic moment associated with the target, wherein said magnetic moment is indicative of a classification of the target.

14. A system as in claim 12 further comprising a non-magnetic targeting device coupled to said positioner and aligned with said magnetic anomaly sensing system.

15. A system as in claim 12 further comprising a second positioner located a distance from said non-magnetic positioner and being capable of adjustment in elevation and azimuth, said processor determining adjustments in elevation and azimuth of said second positioner for alignment thereof with the target as the target is moving using said bearing and range along with said velocity and said distance.

16. A system as in claim 15 further comprising a targeting device coupled to said second positioner and aligned therewith.

17. A system as in claim 12 wherein said magnetic anomaly sensing system includes a sensor array comprising a plurality of triaxial magnetometer (TM) sensors with each of said TM sensors having X,Y,Z magnetic sensing axes, said plurality of said TM sensors arranged in a three-dimensional array with respective ones of said X,Y,Z magnetic sensing axes being mutually parallel to one another in said three-dimensional array, said three-dimensional array defining a geometry that (i) collinearly aligns at least three of said plurality of TM sensors in a spaced-apart fashion along an axis to form a plurality of single-axis gradiometers along one of said X,Y,Z magnetic sensing axes, and (ii) positions at least four of said plurality of TM sensors in a spaced-apart fashion in a planar array that is perpendicular to said axis.

18. A system as in claim 17 wherein three TM sensors from said plurality of TM sensors are collinearly aligned along said axis and are evenly spaced therealong, wherein a central one of said three TM sensors is centrally positioned between a remaining two of said three TM sensors.

19. A system as in claim 18 wherein said planar array includes said central one of said three TM sensors.

20. A system as in claim 19 wherein said planar array forms a square having one of said plurality of said TM sensors at each corner thereof.

21. A system as in claim 20 wherein said central one of said three TM sensors lies at the center of said square.

22. A system as in claim 12 wherein said magnetic anomaly sensing system includes a sensor array comprising a plurality of triaxial magnetometer (TM) sensors with each of said TM sensors having X,Y,Z magnetic sensing axes, said plurality of said TM sensors arranged in a cubic array with respective ones of said X,Y,Z magnetic sensing axes being mutually parallel to one another in said cubic array.

23. A system for tracking a moving target that has a magnetic signature, comprising:
  a non-magnetic positioner capable of being adjusted in elevation and azimuth;
  a magnetic anomaly sensing system coupled to said positioner for movement therewith, said magnetic anomaly sensing system including a sensor array comprising a plurality of triaxial magnetometer (TM) sensors with each of said TM sensors having X,Y,Z magnetic sensing axes, said plurality of said TM sensors arranged in a three-dimensional array with respective ones of said X,Y,Z magnetic sensing axes being mutually parallel to one another in said three-dimensional array, said magnetic anomaly sensing system determining magnetic gradient tensors associated with the target and converting said magnetic gradient tensors to gradient contraction scalars; and
  a processor coupled to said magnetic anomaly sensing system and said positioner, said processor using said magnetic gradient tensors and said gradient contraction scalars to determine at least bearing and range to the target with determination of said range accounting for asphericity errors introduced by the aspherical nature of constant magnetic gradient contours associated with the target, wherein a velocity of the target is determined using said bearing and range so-determined at two points in time as the target is moving, said processor determining (i) adjustments in elevation and azimuth of said positioner using said magnetic gradient tensors and said gradient contraction scalars along with said bearing and range and said velocity, and (ii) providing said adjustments to said positioner, wherein said magnetic anomaly sensing system continually determines said magnetic gradient tensors associated with the target as the target is moving.

24. A system as in claim 23 wherein said processor uses (i) said magnetic gradient tensors, (ii) said gradient contraction scalars, and (iii) said range, to determine the magnetic moment associated with the target, wherein said magnetic moment is indicative of a classification of the target.

25. A system as in claim 23 further comprising non-magnetic targeting device coupled to said positioner and aligned with said magnetic anomaly sensing system.

26. A system as in claim 23 further comprising a second positioner located a distance from said non-magnetic positioner and being capable of adjustment in elevation and azimuth, said processor determining adjustments in elevation and azimuth of said second positioner for alignment thereof with the target as the target is moving using said bearing and range along with said velocity and said distance.

27. A system as in claim 26 further comprising a targeting device coupled to said second positioner and aligned therewith.

28. A system as in claim 23 wherein said three-dimensional array defines a geometry that (i) collinearly aligns at least three of said plurality of TM sensors in a spaced-apart fashion along an axis of said X,Y,Z magnetic sensing axes, and (ii) positions at least four of said plurality of TM sensors in a spaced-apart fashion in a planar array that is perpendicular to said axis.

29. A system as in claim 23 wherein said three-dimensional array is a cubic array.

* * * * *